United States Patent
Naik et al.

(10) Patent No.: US 8,951,911 B2
(45) Date of Patent: Feb. 10, 2015

(54) PROCESS FOR DAMASCENE STRUCTURE WITH REDUCED LOW-K DAMAGE

(75) Inventors: Mehul B. Naik, San Jose, CA (US); Zhenjiang Cui, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 622 days.

(21) Appl. No.: 13/174,621

(22) Filed: Jun. 30, 2011

(65) Prior Publication Data

US 2012/0252206 A1 Oct. 4, 2012

Related U.S. Application Data

(60) Provisional application No. 61/470,386, filed on Mar. 31, 2011.

(51) Int. Cl.
*H01L 21/44* (2006.01)
*H01L 21/02* (2006.01)
*H01L 21/768* (2006.01)

(52) U.S. Cl.
CPC .... *H01L 21/02697* (2013.01); *H01L 21/76885* (2013.01); *H01L 21/7681* (2013.01); *H01L 21/76834* (2013.01); *H01L 21/7685* (2013.01); *H01L 21/76856* (2013.01); *H01L 21/76873* (2013.01)
USPC ........... 438/653; 438/639; 438/644; 438/675; 257/E21.584

(58) Field of Classification Search
USPC .......... 438/637–653; 257/758–774, E21.581, 257/E21.584, E21.579
See application file for complete search history.

(56) References Cited

U.S. PATENT DOCUMENTS

| | | | |
|---|---|---|---|
| 6,455,425 B1 * | 9/2002 | Besser et al. | 438/687 |
| 6,780,753 B2 | 8/2004 | Latchford et al. | |
| 7,115,534 B2 | 10/2006 | Nguyen et al. | |
| 7,618,889 B2 | 11/2009 | Naik | |
| 2002/0175417 A1 * | 11/2002 | Morrow | 257/758 |
| 2006/0003576 A1 * | 1/2006 | Yeh et al. | 438/638 |
| 2009/0093100 A1 * | 4/2009 | Xia et al. | 438/421 |
| 2009/0093112 A1 | 4/2009 | Al-Bayati et al. | |
| 2009/0096102 A1 * | 4/2009 | Gambino et al. | 257/751 |
| 2010/0151671 A1 | 6/2010 | Demos et al. | |
| 2010/0227471 A1 * | 9/2010 | Leung et al. | 438/637 |

\* cited by examiner

*Primary Examiner* — Charles Garber
*Assistant Examiner* — Abdulfattah Mustapha
(74) *Attorney, Agent, or Firm* — Patterson & Sheridan, LLP

(57) ABSTRACT

Embodiments described herein generally provide methods for reducing undesired low-k damages during a damascene process using a sacrificial dielectric material and optionally a barrier/capping layer. In one embodiment, a damascene structure is formed through a sacrificial dielectric material deposited over a dielectric base layer. The damascene structure is filled with a suitable metal such as copper. The sacrificial dielectric material filled in trench areas between the copper damascene is then removed, followed by a barrier/cap layer which conformally or selectively covers exposed surfaces of the copper damascene structure. Ultra low-k dielectric materials may then fill the trench areas that were previously filled with sacrificial dielectric material. The invention prevents the ultra low-k material between the metal lines from exposing to various damaging processes during a damascene process such as etching, stripping, wet cleaning, pre-metal cleaning or CMP process.

1 Claim, 10 Drawing Sheets

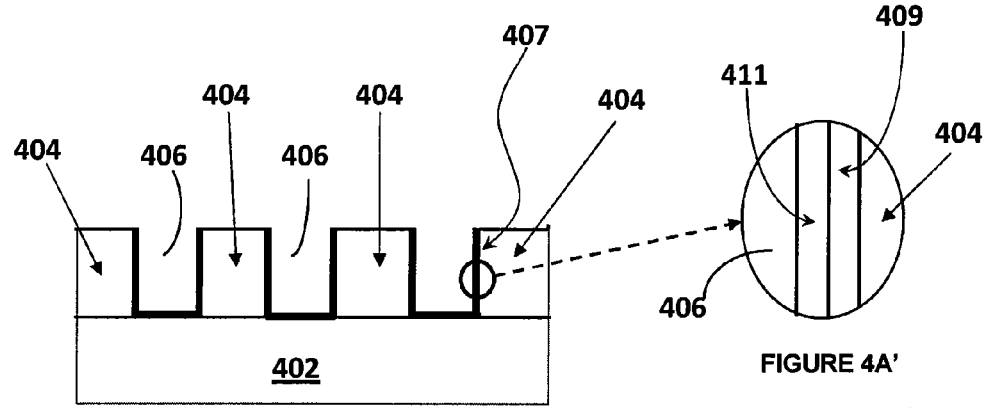
FIGURE 4A
FIGURE 4A'
(ALTERNATIVE EMBODIMENT)
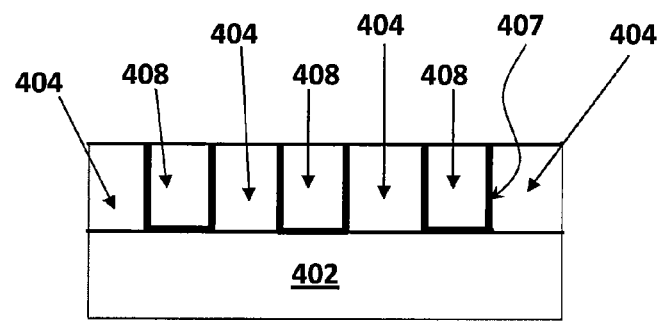
FIGURE 4B
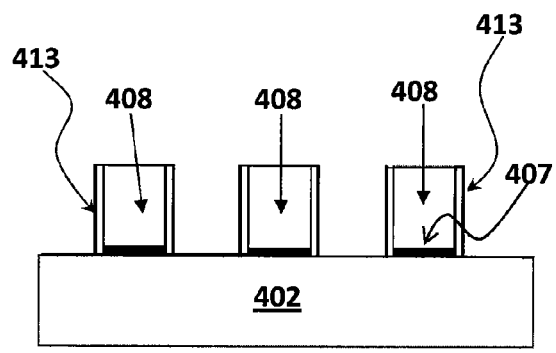
FIGURE 4C (ALTERNATIVE EMBODIMENT A)

(ALTERNATIVE EMBODIMENT B)

(ALTERNATIVE EMBODIMENT C)

PROCESS FOR DAMASCENE STRUCTURE WITH REDUCED LOW-K DAMAGE

CROSS-REFERENCE TO RELATED APPLICATIONS

This application claims benefit of U.S. provisional patent application Ser. No. 61/470,386, filed Mar. 31, 2011, entitled "PROCESS FOR DAMASCENE STRUCTURE WITH REDUCED LOW-K DAMAGE", which is herein incorporated by reference.

BACKGROUND OF THE INVENTION

1. Field of the Invention

Embodiments of the present invention generally relates to semiconductor processing technologies and, more specifically, to improved methods for fabricating a damascene structure without damaging low-k dielectric materials in the structure.

2. Description of the Related Art

Integrated circuits have evolved into complex devices that can include millions of components (e.g., transistors, capacitors and resistors) on a single chip. The demand for greater circuit density necessitates a reduction in the dimensions of the integrated circuit components, e.g., sub-micron dimensions and the use of various materials to fabricate devices in order to achieve much faster and better electrical performance, such as materials with higher conductivity used in metal lines, materials with lower permittivity (low-k) dielectric constant used as insulating materials, etc. For integrated circuit fabrication, metal interconnects with low resistance, such as copper and aluminum interconnects, provide conductive paths between the integrate circuit components on integrated circuit devices. Generally, metal interconnects are electrically isolated from each other by a dielectric bulk insulating material. At sub-micron dimensions, capacitive coupling potentially occurs between adjacent metal interconnects, which may cause cross talk and/or resistance-capacitance (RC) delay and degrade the overall performance of the integrated circuit.

One method for forming vertical and horizontal interconnects for the integrated circuit components is by a damascene or dual damascene method. Typically, damascene structures have dielectric bulk insulating layers and conductive metal layers, such as low dielectric constant materials and conductive copper layers, stacked on top of one another. Vertical interconnects, i.e., vias, and horizontal interconnects, i.e., trenches are etched into the dielectric bulk insulating layer and the conductive metal layers are subsequently filled into the vias and/or trenches and planarized, such as by a chemical mechanical planarization process (CMP), so that the conducting metal materials are only left in the vias and/or trenches. In the damascene approach, a rather complex dielectric film stack that includes a sequence of hard mask, low-k dielectrics, and etch stop layers, etc., may be required. To obtain such a stack, via/trench lithography, patterning, and wet cleanings are typically required before filing the vias and the trenches with the conductive metal materials.

However, low-k materials of the damascene structure are susceptible to various damages during subsequent processing steps, such as etching, wet-cleaning, pre-metal cleaning, or CMP etc. Such damages can severely increase the dielectric constant of the low-k materials, causing the overall dielectric constant of the resulting dielectric film stack to increase.

Therefore, there is a need for a process of making damascene structures with zero or minimized damages to low-k materials in the dielectric film stack.

SUMMARY OF THE INVENTION

In one embodiment, the method for forming a semiconductor structure comprising depositing a sacrificial dielectric material over a dielectric base layer, forming a damascene feature into the sacrificial dielectric material and the dielectric base layer, filling the damascene feature with a conductive material, removing the sacrificial dielectric material located trench areas between the filled damascene feature, and filling the trench areas with a low-k dielectric material. In one aspect, the method further includes selectively depositing a passivating layer made of cobalt or a cobalt alloy on a top surface of the conductive material. In another aspect, before removing the sacrificial dielectric material, a tantalum/tantalum nitride (Ta/TaN) barrier layer may be conformally on exposed surfaces of the trench areas to provide an effective barrier to prevent copper migration into surrounding layers. A copper-containing layer such as a copper-manganese (CuMn) alloy may be further deposited onto the Ta/TaN barrier layer to improve electrical properties of the circuit device, such as electromigration resistance, while also serves as a seed layer for the subsequent copper deposition. In one example, the copper-manganese (CuMn) alloy may be treated with a thermal treatment process to form a self-forming manganese oxide ($MnO_x$) layer, thereby enhancing passivation of copper.

In another embodiment, the method for forming a semiconductor structure comprising depositing a first via dielectric layer over a dielectric base layer, depositing a first sacrificial dielectric material over the first via dielectric layer, forming desired trench patterns into the first sacrificial dielectric material and the first via dielectric layer, conformally depositing a conductor layer onto exposed surfaces of the trench patterns, filling the trench patterns with a conductive material and planarizing the conductive material to expose the first sacrificial dielectric material, removing the sacrificial dielectric material from areas between the filled trench patterns, and filling the areas between the filled trench patterns with an ultra low-k dielectric material.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 4A-4G illustrate schematic cross-sectional views of a substrate during different stages using a process sequence of FIG. 3.

DETAILED DESCRIPTION

Figure 1A:
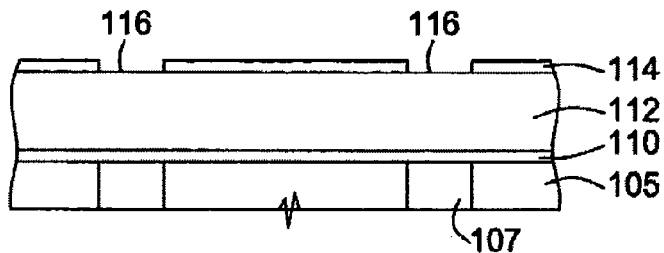
FIGS. 1A-1I illustrate schematic cross-sectional views of a substrate during different stages using a process sequence of FIGS. 2A and 2B.

Embodiments described herein generally provide methods for reducing undesired low-k damages during a damascene process using a sacrificial dielectric material and optionally a barrier/capping layer. In various embodiments, a damascene structure is formed through a sacrificial dielectric material deposited over a preexisting base layer, which may be one or more dielectric materials such as doped or undoped silicon oxides having conductive features formed therein. The damascene structure is filled with a suitable metal such as copper. The sacrificial dielectric material filled in trench areas between the copper damascene is then removed, followed by various barrier/cap schemes conformally or selectively covering exposed surfaces of the copper damascene structure. Thereafter, ultra low-k dielectric materials may fill the trench areas that were previously filled with sacrificial dielectric material. The process may be repeated as necessary with any desired pattern and etch process to build more dielectric layers and/or structures on the filled ultra low-k dielectric materials, thereby extending the interconnect lines in the device.

In contrast to conventional fabrication schemes having low-k damage problems, the inventive process flow prevents the ultra low-k dielectric material between the metal lines from exposing to various damaging processes during a damascene process such as etching, stripping, wet cleaning, pre-metal cleaning or CMP process, resulting in a damascene structure with an integrated or overall dielectric constant close to the bulk valve for the low-k materials. Various metal passivation processes which perform before or after filling of copper or removal of sacrificial dielectric materials further enhance copper electromigration resistance and therefore improving overall device performance.

Dual Damascene Application

FIGS. 1A-1I illustrate one of the embodiments of the present invention, showing schematic cross-sectional views of a substrate during different stages in a processing sequence performed to form a dual damascene structure. FIGS. 2A and 2B demonstrate an exemplary process sequence 200 for fabricating and etching a dual damascene structure shown in FIGS. 1A-1I according to one or more embodiments of the invention. FIG. 2B is the continuation of FIG. 2A showing the process sequence 200. The process sequence 200 is generally compatible with various film deposition and etching processes as well as various damascene fabrication schemes, such as via first fabrication schemes, BARC etch-back fabrication schemes, dual hard mask fabrication schemes, tri-layer fabrication schemes, dual hard mask transfer fabrication schemes, etc. It should be noted that while the steps in FIGS. 1A-1I are described based on a tri-layer scheme, other patterning schemes such as a TiN hardmask based approach may be used. The number, order and sequence of steps illustrated in FIGS. 1A-1I are not intended to limiting as to the scope of the invention described herein, since one or more steps can be added, deleted and/or reordered without deviating from the basic scope of the invention described herein.

Figure 2A:
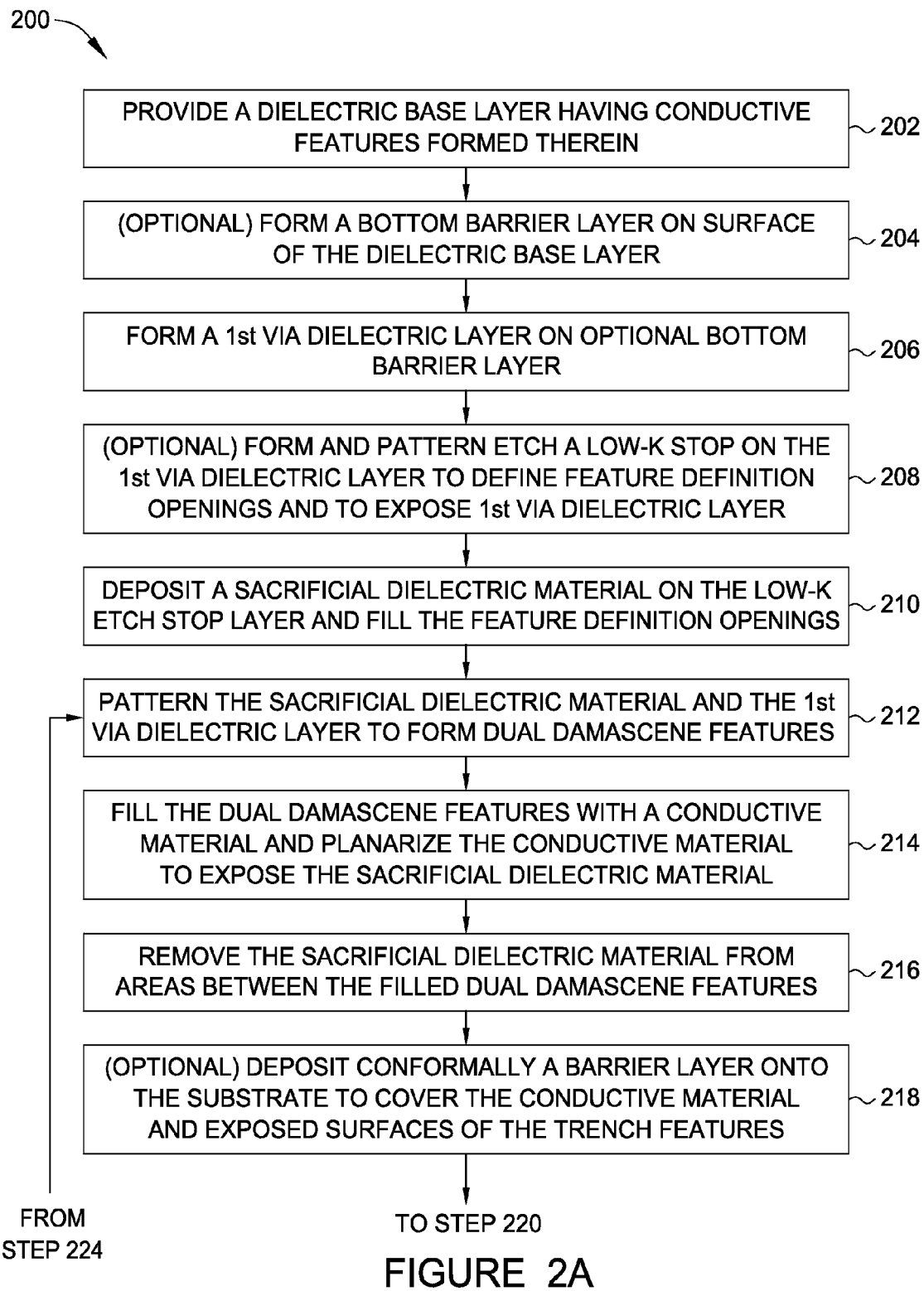
FIGS. 2A and 2B illustrate an exemplary process sequence for fabricating and etching a dual damascene structure shown in FIGS. 1A-1I according to one or more embodiments of the invention.
Figure 2B:
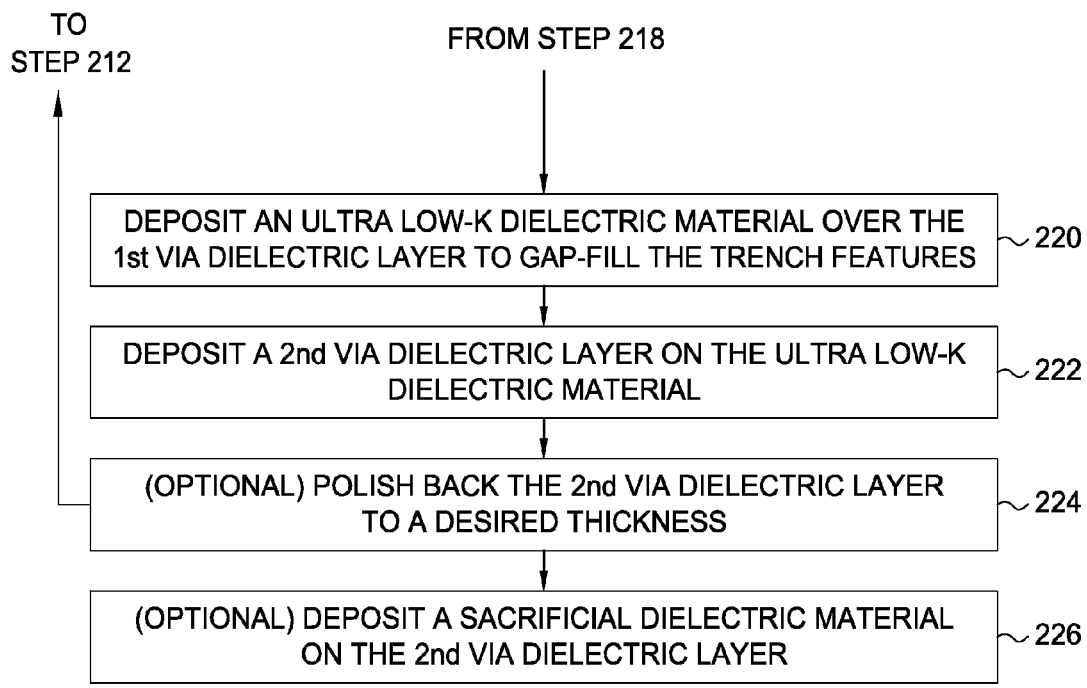

In step 202, a dielectric base layer 105 having conductive features 107, such as copper features, formed therein is provided as shown in FIG. 1A. The dielectric base layer 105 may be a low-k dielectric material having a dielectric constant less than about 7, for example, less than about 5 or even less than about 2.5, such as carbon-doped silicon dioxide dielectric materials, organic polymers, organosilicate, organo-silicate glass (OSG) materials, spin-on glass materials, fluorine-doped silicon glass (FSG) materials, or the like that are doped with a carbon-based dopant. The dielectric base layer 105 may be of any desirable sizes, and may include one or more dielectric layers having a conductive feature, such as metal lines, formed thereon. While not shown, the conductive materials features 107 may be contacted with devices such as field effect and bipolar transistors, diodes, capacitors, resistors, and inductors etc. that can be wired together to form an integrated circuit.

In step 204, optionally, a bottom barrier layer 110 may be formed on the upper surface of the dielectric base layer 105 as shown in FIG. 1A to eliminate inter-level diffusion between the dielectric base layer 105 and subsequently deposited materials. The bottom barrier layer 110 may be deposited using any suitable methods such as ALD or CVD based approaches. The bottom barrier layer 110 can be a low-k dielectric material, which includes, but is not limited to carbon containing silicon materials such as silicon oxycarbides (SiOC) or silicon carbides, silicon nitrides (SiN) or carbon containing silicon nitride materials (SiCN), and combinations thereof, or boron nitride (BN), silicon boron nitride (SiBN), silicon boron carbide nitride (SiBCN), or combinations thereof. In case where the bottom barrier layer 110 is a silicon carbide based barrier layer, the silicon carbide based barrier layer may be plasma treated or exposed to an e-beam treatment to improve its adhesion to the dielectric base layer 105.

In step 206, a first via dielectric layer 112, such as silicon oxides or silicon oxycarbides, is deposited on the optional bottom barrier layer 110 as shown in FIG. 1A. The first via dielectric layer 112 may be a dielectric material having a low dielectric constant, such as less than 7.0, e.g, a dielectric constant between about 2 and about 5. Examples of suitable materials for the first via dielectric layer 112 may include, but are not limited to, organosilicate materials, porous oxide materials, silsesquioxane materials, paralyne, carbon-doped dielectrics materials (e.g., carbon-doped organo-silicate glass (OSG), carbon-doped silicon dioxide, etc.), spin-on glass materials (e.g., un-doped silicon glass (USG), a fluorine-doped silicon glass (FSG), etc.), carbon containing silicon materials, silicon oxycarbides (SiOC), and combinations thereof. Examples of an organosilicate-based low-k carbon-containing silicon oxides (SiOC) dielectric material include BLACK DIAMOND® I and BLACK DIAMOND® II available from Applied Materials, Inc., of Santa Clara, Calif. The first via dielectric layer 112 may be deposited to a thickness of about, for example, 5,000 Å to about 15,000 Å, depending on the size of the structure to be fabricated. The first via dielectric layer 112 may then be treated by a plasma process or e-beam technique to remove contaminants and densify the surface of the first via dielectric layer 112.

In step 208, an optional low-k etch stop layer 114, may be deposited on the first via dielectric layer 112 to a thickness of about 5 Å to about 1,000 Å, as shown in FIG. 1A. The optional low-k etch stop layer 114 may be a silicon carbide material or any other suitable materials such as a silicon nitride. If desired, the low-k etch stop layer 114 may be plasma treated as described above for the bottom barrier layer 110. The low-k etch stop layer 114 may be pattern etched to define the feature definition openings 116 (e.g., via patterns) and to expose the first via dielectric layer 112 in the areas where the feature definitions 120 are to be formed (FIG. 1C). Alternatively, the low-k etch stop layer 114 may be pattern etched along with the subsequent layers such as the hard mask material 119, sacrificial dielectric material 118 and underlying first via dielectric layer 112, etc. at a later stage when forming the feature definitions 120 (FIG. 1C). The low-k etch stop layer 114 may be pattern etched using conventional photolithography and etch processes using fluorine, carbon, and oxygen ions. If desired, a nitrogen-free silicon carbide (not shown) or silicon oxide cap layer (not shown) may be deposited on the low-k etch stop layer 114 prior to depositing further materials.

Figure 1B:
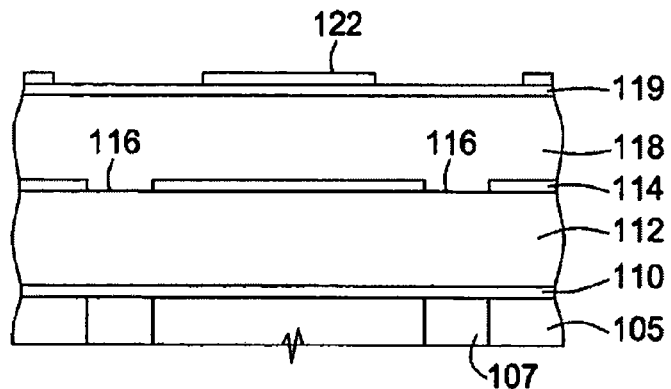
Figure 1C:
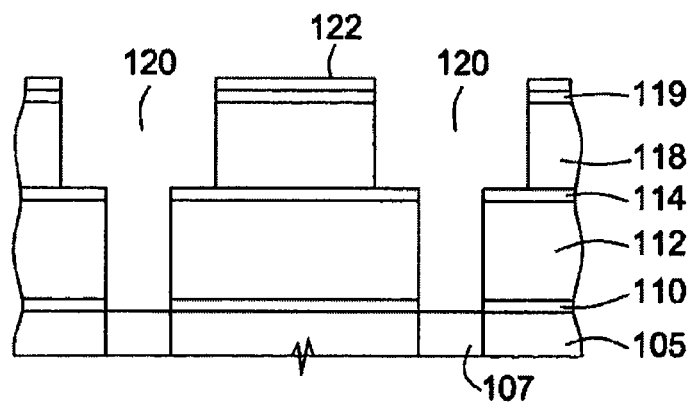

In step 210, a sacrificial dielectric material 118 is deposited on the low-k etch stop layer 114 (if used) and fill the feature definition openings 116, as shown in FIG. 1B. The sacrificial dielectric material 118 can be organic or inorganic and the key requirement being compatibility with ease of damascene copper processing as described below and ease of subsequent removal with no damage to the metallization structure as well as underlying first via dielectric layer 112. The sacrificial dielectric material 118 may include, but is not limited to oxides, silicon oxides, silicon dioxides, silicon nitrides, or organic polymers such as polyimides and polyarylene ethers and combination thereof or equivalents. Alternatively, the sacrificial dielectric material 118 may be the same material as the first via dielectric layer 112. The sacrificial dielectric material 118 is deposited to a thickness equal to that needed for the desired trench feature definitions. In one aspect, the sacrificial dielectric material 118 may be deposited to a thickness of about 500 Å to about 3,000 Å, such as 1,800 Å.

In step 212, a photoresist material layer 122 may be deposited on the sacrificial dielectric material 118 and patterned using conventional photolithography and etching processes to transfer a desired trench and via pattern into the sacrificial dielectric material 118 and the first via dielectric layer 112, respectively. The trench pattern may be wider than the feature definition openings 116. The bulk dielectric layers (i.e., the sacrificial dielectric material 118, optional low-k etch stop layer 114, and underlying first via dielectric layer 112, etc.) may be etched using reactive ion etching or other anisotropic etching techniques to form the dual damascene features 120 as shown in FIG. 1C. Any residual photoresist used to pattern the bulk dielectric layers is then removed using an oxygen strip or other suitable stripping process. Hard mask material, when used, may be removed at this point.

In certain embodiments, a conformal layer of hard mask material 119 may be formed between the photoresist material 122 and the sacrificial dielectric material 118 as shown in FIG. 1B. In such a case, the hard mask material 119 would be patterned using the photoresist material 122 as a mask, and then the pattern may be transferred into the sacrificial dielectric material 118 in a separate etch step. In one example, a chemical vapor deposition (CVD) carbon hard mask, for example, an advance patterning Film™ (APF) may be used. APF may be desirable because it is easily etched with extremely high selectivity to most device materials, such as oxides, nitrides, tungsten, and/or polys. The carbon hard mask also allows one to extend the amount of device etching which may simplify eventual hardmask removal with an $O_2$ plasma ash.

It should be understood by those ordinary skill in the art that the dual damascene features 120 shown in FIG. 1C may be formed by any of suitable approaches such as conventional photolithographic patterning and dry etching processes. For example, the dual damascene features 120 may be formed by a via-first process where a first photolithographic patterning process is carried out to pattern and etch a via opening, followed by a second photolithographic patterning process to pattern and etch a trench opening overlying the via opening. Alternatively, the dual damascene features 120 may be formed by conventional tri-layer fabrication schemes or hard mask schemes as described above for forming a dual damascene structure (or any structure having one or more via portions and one or more trench portions). Therefore, the present invention of forming the dual damascene features 120 is not limited to the process flow as described and shown in FIGS. 1A and 1B.

Figure 1D:
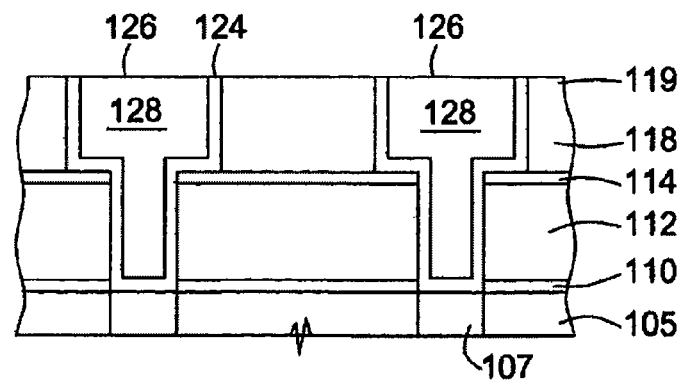

In step 214, the metallization structure is then formed by filling a conductive material 126 such as copper, aluminum, tungsten or combinations within the dual damascene features 120 using chemical vapor deposition, physical vapor deposition, electroplating, or combinations thereof. In one embodiment, copper is used to fill the dual damascene features 120, as shown in FIG. 1D. Optionally, a suitable barrier layer 124, such as tantalum nitride, may be first deposited conformally in the metallization pattern to prevent copper migration into the surrounding silicon and/or dielectric material. In certain embodiments, this barrier layer 124 may be a copper-containing material such as a copper-manganese (CuMn) alloy as will be described below with respect to step 304. Once the dual damascene features 120 have been filled with copper or other metal, the surface of the conductive material 126 is planarized to expose the sacrificial dielectric material using chemical mechanical polishing, forming a dual damascene structure 128 filled with conductive material 126 as shown in FIG. 1D.

Figure 1E:
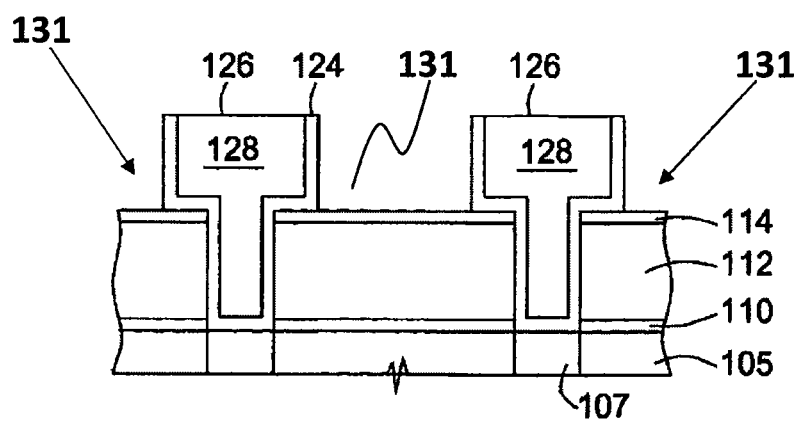

In step 216, the sacrificial dielectric material 118 presented in the area between the dual damascene structures 128 (or conductive materials 126) is removed using a wet clean or dry etch process, thereby forming trench features 131 as shown in FIG. 1E. The etch process should have good etch selectivity with respect to the conductive materials 126 and underlying first via dielectric layer 112. Such high etch selectivity would allow removal of the sacrificial dielectric material 118 without significant dielectric loss during etch process. In cases where wet etch process is adapted, the structure may be etched by exposing the structure to a dilute HF solution that wet etches dielectric layer 118 at a significantly higher rate than it may wet etch the conductive materials 126 and underlying low-k etch stop layer 114 and/or first via dielectric layer 112. In various embodiments, an etching selectivity of sacrificial dielectric material 118 to the underlying low-k etch stop layer 114 and/or first via dielectric layer 112 may be in a range between about 2:1 and about 100:1.

In cases where the underlying first via dielectric layer 112 is silicon oxides, a dry etch process, such as SiCoNi etch process, may be adapted. A SiCoNi etching is a dry etch process for removing silicon oxides using, for example, an ammonia ($NH_3$) and nitrogen trifluoride ($NF_3$) gas mixture performed within a plasma processing chamber, such as a SICONI® Pre-clean chamber, to selectively remove various oxides from the surface of the substrate. While not discussed here, it is contemplated that the ratio of the etching gas mixture and the amount of each gas introduced into the chamber are variable and may be adjusted to accommodate, for example, the thickness of the materials to be removed and the geometry of the substrate being cleaned, etc. Additional description of processes and apparatus for SiCoNi etching can be found, for example, in the U.S. Patent Publication 2007/0123051, entitled "Oxide Etch with $NH_3$—$NF_3$ Chemistry," which is incorporated herein by reference to the extent not inconsistent with the description and claims herein.

Figure 1F:
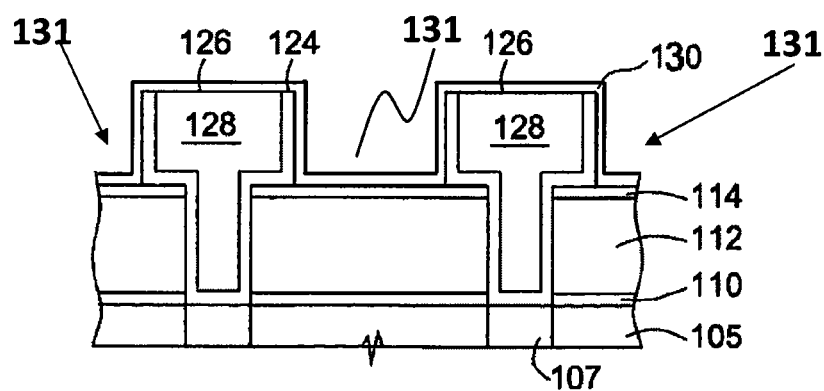

In step 218, an optional barrier layer 130 may be deposited conformally onto the substrate covering the conductive material 126 and substantially all exposed surfaces of the trench features 131 where the sacrificial dielectric material 118 was previously located, as shown in FIG. 1F. The barrier layer 130 is deposited to protect conductive materials 126 from oxidation during the subsequent gap-fill process or to eliminate inter-level diffusion between the first via dielectric layer 112 and subsequently deposited materials. The barrier layer 130 may be deposited using any suitable methods such as ALD or CVD based approaches. The material for the barrier layer 130 can be similar to the bottom barrier layer 110 as discussed previously at step 204. One exemplary material for the barrier layer is a BLOk™ (barrier low-k) film, which is a silicon carbide film available from Applied Materials, Inc., Santa Clara, Calif. In one example, the optional barrier layer 130 may be deposited to a thickness of about, for example, 5 Å to about 200 Å. Alternatively, this barrier layer 130 may be a self-forming manganese oxide ($MnO_x$) barrier layer as will be described below with respect to step 308.

Figure 1G:
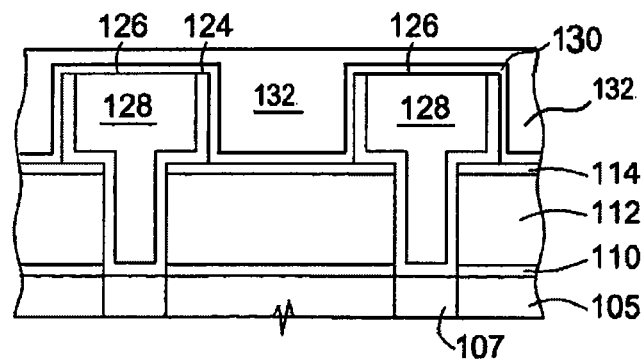

In step 220, an ultra low-k (ULK) dielectric material 132 is deposited over the first via dielectric layer 112 (i.e., on the optional barrier layer 130 when used) to gap-fill the trench features 131 (FIG. 1F) as shown in FIG. 1G. If desired, the ultra low-k dielectric material 132 may be over deposited in order to adequately fill the trench features 131. The ultra low-k dielectric material 132 may be deposited to a desired thickness equal to that needed for the desired trench feature definitions. The ultra low-k dielectric material 132 may be obtained by incorporating air voids within a low-k dielectric matrix, creating a porous dielectric material. Methods of fabricating porous dielectrics typically involve forming a "precursor film" containing two components: a porogen (typically an organic material such as a hydrocarbon) and a structure former or dielectric material (e.g., a silicon containing material). Once the precursor film is formed on the substrate, the porogen component can be removed using a thermal process (at a temperature sufficient for the breakdown and vaporization of the organic porogen), leaving a structurally intact porous dielectric matrix or oxide network. The ultra low-k dielectric material 132 may have a dielectric constant less than about 5, for example, less than about 3 or less than about 2.5. It is contemplated that the ultra low-k dielectric material 132 may be replaced with any suitable dielectric materials such as the dielectric base layer 105 or the first via dielectric layer 112 as described above, depending upon application.

Figure 1H:
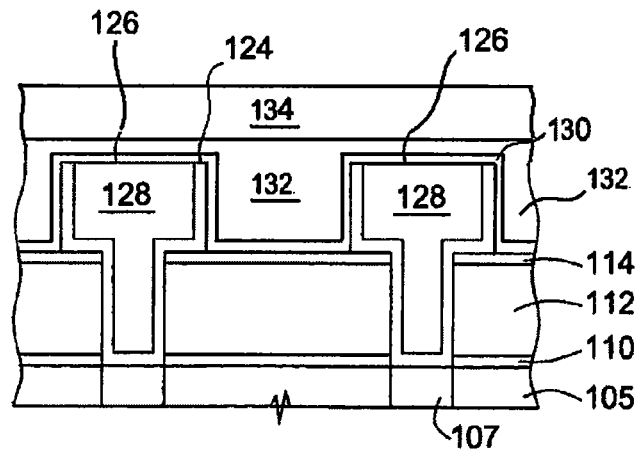

In step 222, once gap-fill is complete, a second via dielectric layer 134 is deposited on the ultra low-k dielectric material 132 as shown in FIG. 1H. The second via dielectric layer 134 may be a low-k material similar to the first via dielectric layer 112 as discussed previously at step 206. The second via dielectric layer 134 may be deposited to a thickness of about, for example, 500 Å to about 15,000 Å, depending on the size of the structure to be fabricated.

Figure 1I:
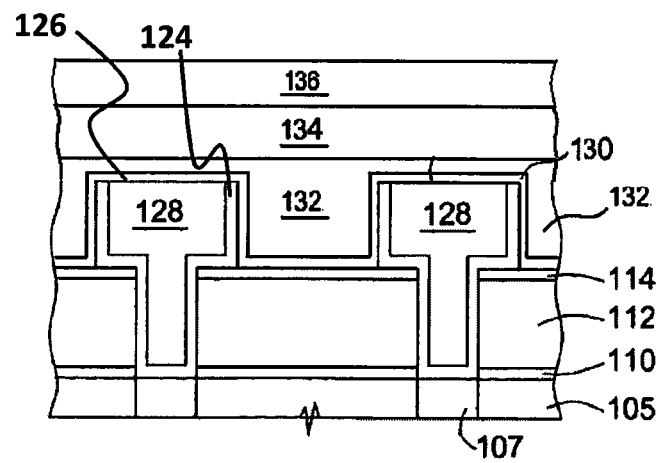

In step 224, the second via dielectric layer 134 may be optionally etched or polished back such that the second via dielectric layer has a desired dielectric thickness equal to that needed for the application, as shown in FIG. 1I.

In step 226, an optional sacrificial dielectric layer 136 may be deposited on the second via dielectric layer 134 and the processes described in steps 212-224 may be repeated as necessary to extend the interconnect lines in the dual damascene structure. The material for the optional sacrificial dielectric layer 136 may be similar to the sacrificial dielectric layer 118 described in step 210 above. Alternatively, the optional sacrificial dielectric layer 136 may have a material similar to the dielectric base layer 105. While not shown, the optional sacrificial dielectric layer 136 may include conductive features, such as copper interconnects, formed therein, if the processes described in steps 212-224 were performed.

Single Damascene Application

Figure 3:
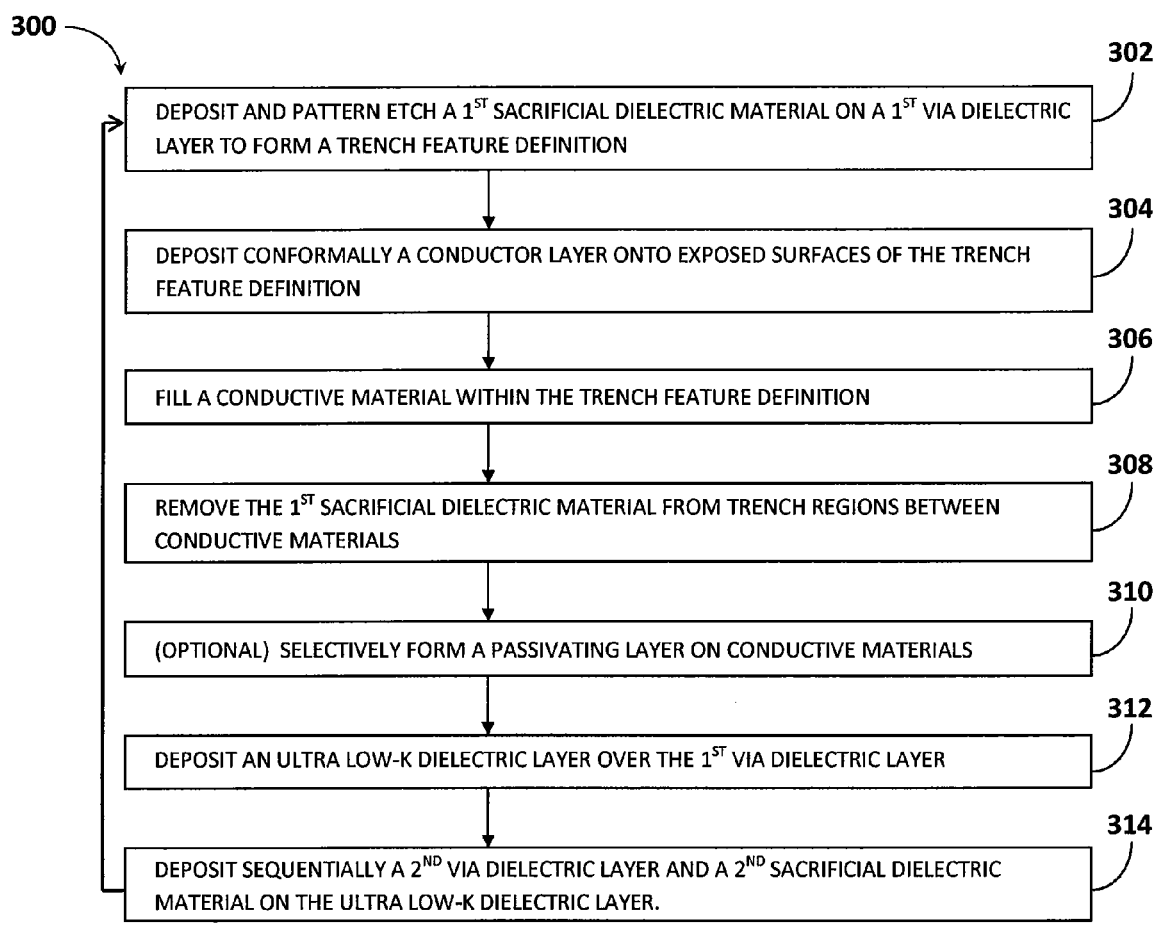
FIG. 3 illustrates an exemplary process sequence for fabricating and etching a single damascene structure.

FIG. 3 demonstrates an exemplary process sequence 300 for fabricating and etching a single damascene structure, for example, a single damascene structure shown in FIGS. 4A-4D, in accordance with the present invention.

In step 302, a first sacrificial dielectric material 404 is deposited over a first via dielectric layer 402 and pattern etched to form vertical interconnects of a feature definition 406 as shown in FIG. 4A. The feature definition 406 is generally formed to expose a portion of the underlying first via dielectric layer 402. The first sacrificial dielectric material 404 may be deposited to a thickness needed for the desired trench feature definitions. The material for the first via dielectric layer 402 may be similar to the first via dielectric layer 112 as described above at step 206. Similarly, the material for the first sacrificial dielectric material 404 may be similar to the sacrificial dielectric material 118 as described above at step 210. Alternatively, the first sacrificial dielectric material 404 may use the same material as the dielectric base layer 402.

In certain embodiments, prior to deposition of the first sacrificial dielectric material 404, an optional barrier layer (not shown) may be deposited onto the first via dielectric layer 402 to eliminate inter-level diffusion between the first via dielectric layer 402 and subsequently deposited materials. One exemplary material for this optional barrier layer is a BLOk™ (barrier low-k) film, which is a silicon carbide film available from Applied Materials, Inc., Santa Clara, Calif. In one aspect, the optional barrier layer 130 may be deposited to a thickness of about, for example, 5 Å to about 800 Å, such as about 500 Å.

In step 304, a conductor layer 407 is conformally deposited onto the exposed surfaces of the feature definition 406 (e.g., side walls and the bottom) as shown in FIG. 4A. In one embodiment, the conductor layer 407 may include a copper-containing material such as a copper-manganese (CuMn) alloy. The CuMn alloy is believed to improve electrical properties of the circuit device, such as electromigration resistance, while also serves as a seed layer for the subsequent copper deposition.

In an alternative embodiment as shown in FIG. 4A', the conductor layer 407 may be a barrier/seed layer including a barrier layer 409 and a seed layer 411 deposited on the barrier layer 409. This barrier layer 409 may help to prevent diffusion of subsequent copper atoms into the surrounding low-k dielectrics. In such a case, the barrier layer 409 may include one or more barrier materials such as, for example, tantalum, tantalum nitride, tantalum silicon nitride, titanium, titanium nitride, titanium silicon nitride, tungsten nitride, silicon nitride, ruthenium nitride, derivatives thereof, alloys thereof and combinations thereof. The barrier layer 409 may be formed using a suitable deposition process, such as ALD, CVD, PVD or electroless deposition. In one example, a Ta/TaN bilayer may be deposited as barrier layer 409, wherein the tantalum layer and the tantalum nitride layer are independently deposited by ALD, CVD and/or PVD processes. Similarly, the seed layer 411 is a copper-containing material similar to the conductor layer 407, which may be a copper-manganese (CuMn) alloy seed layer.

In step 306, a conductive material 408, such as copper, is filled within the etched feature definition 406 using any suitable technique such as chemical vapor deposition, physical vapor deposition, electroplating, or combinations thereof. Once the feature definitions 406 have been filled with the conductive materials 408, a chemical mechanical polishing process may be performed to planarize the conductive materials 408 to expose the underlying first sacrificial dielectric material 404, as shown in FIG. 4B.

In step 308, the first sacrificial dielectric material 404 presented in the trench regions between the conductive materials 408 is removed with a suitable technique such as a wet etch or dry etch process, as shown in FIG. 4C. The etch process should have good etch selectivity with respect to the conductive materials 408 and underlying first via dielectric layer 402. The etch process used for removing the first sacrificial dielectric material 404 may be similar to step 216 as discussed previously.

In certain embodiments, a post-treatment process such as annealing, thermal oxidation process, or the combination thereof may be performed to enhance passivation of copper. As discussed previously, the conductor layer 407 may be a copper-manganese (CuMn) alloy seed layer or a barrier/seed layer including a barrier layer 409 and a CuMn alloy seed layer 411 deposited on the barrier layer 409. In either case, the CuMn alloy seed layer 407 or 411 may be thermally treated in an oxidizing atmosphere so that a portion or all of manganese within the CuMn alloy is oxidized, resulting in a self-forming manganese oxide ($MnO_x$) barrier layer 413 as shown in FIG. 4C. This self-forming manganese oxide barrier layer has been observed to be able to improve electrical properties such as electromigration resistance.

Alternatively, the post-treatment process may be performed during or before the first sacrificial dielectric materials 404 between the conductive materials 408 is removed. In such a case, manganese atoms within the copper-manganese alloy may diffuse into and react with oxygen atoms contained in the adjoining first sacrificial dielectric materials 404, resulting in formation of a self aligned manganese oxide ($MnO_x$) barrier layer. The remaining portion of the first sacrificial dielectric material 404 is then removed.

In step 310, after the first sacrificial dielectric material 404 has been removed, a metal encapsulation process may be performed to selectively deposit a passivating layer 415 on the conductive material 408 to further enhance surface passivation of copper, due to the known fact that copper readily forms copper oxide when exposed to atmospheric conditions or environments. As these metal oxides can result in an increase of the resistance of metal layers and/or become a source of particle problems, the use of the passivating layer not only prevents copper oxidization, but also provides an effective barrier to electromigration of copper into adjacent ultra low-k dielectric layer to be formed onto and gap-filled the trench region between the conductive materials 408.

Figure 4D:
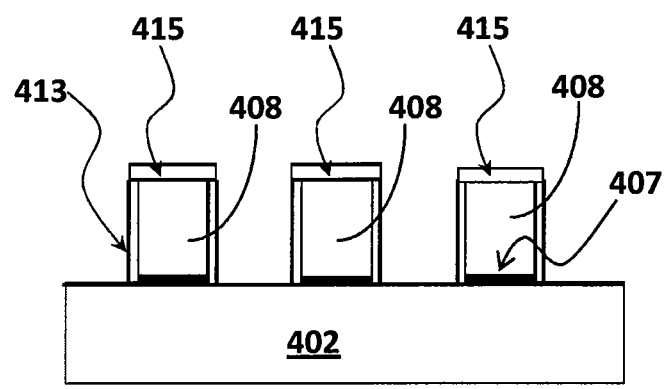

The passivating layer 415 may be a metal that does not form a solid solution with copper or other conductive metals, such as cobalt, ruthenium, tantalum, tungsten, palladium, nickel, tin, titanium, molybdenum, platinum, iron, and niobium and their alloys. In one embodiment, the passivating layer 415 is cobalt or a cobalt alloy, which is electrically conductive and is good barriers to electromigration of copper. Suitable examples for cobalt alloys may include, but are not limited to cobalt-tungsten alloy, cobalt-phosphorus alloy, cobalt-boron alloys, including ternary alloys, such as cobalt-tungsten-phosphorus and cobalt-tungsten-boron. In cases where cobalt or a cobalt alloy is used, the passivating layer 415 may be selectively deposited a top surface of the conductive material 408 by electroless plating techniques, as shown in FIG. 4D. If desired, a catalytic material, such as palladium, may be used on the top surface of the conductive material 408 (i.e., copper) to activate the copper surface to cobalt deposition.

In step 312, an ultra low-k (ULK) dielectric layer 414 is deposited over the first via dielectric layer 402 using a suitable technique such as CVD to gap-fill the trench regions where the first sacrificial dielectric material 404 was previously located, as shown in FIG. 4C. The ultra low-k dielectric layer 414 may be deposited in excess to insure the trench regions are adequately filled. The ultra low-k dielectric layer 414 may be etched or polished back with a suitable technique such as chemical mechanical polishing process to obtain a desired thickness. The material for the ultra low-k dielectric layer 414 may be similar to the ultra low-k dielectric material 132 as described above at step 220. The ultra low-k dielectric layer 414 may have a dielectric constant less than about 3 or less than about 2.5.

Figure 4E:
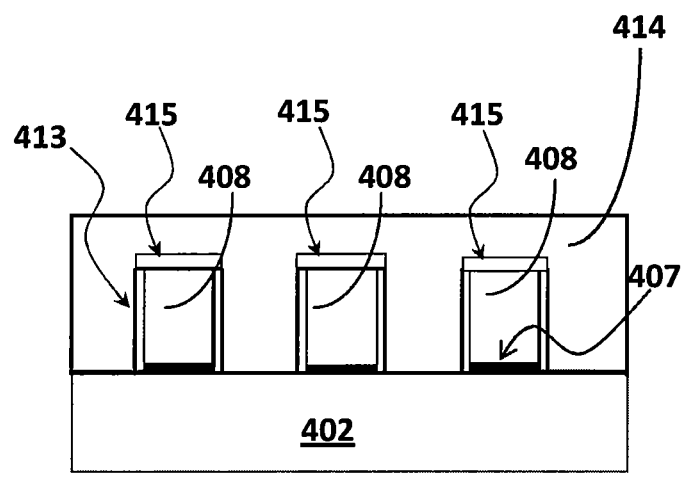
Figure 4E:
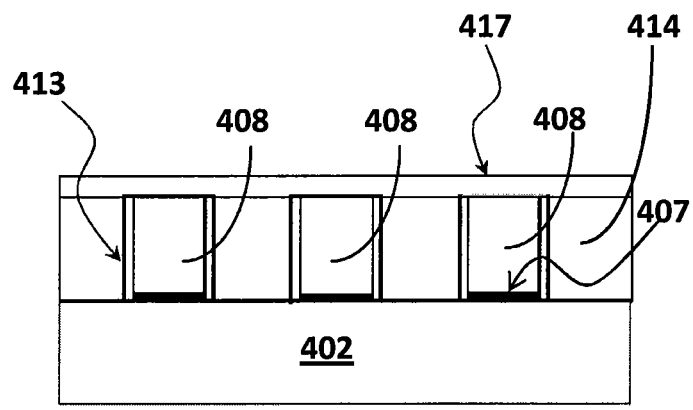
Figure 4E:
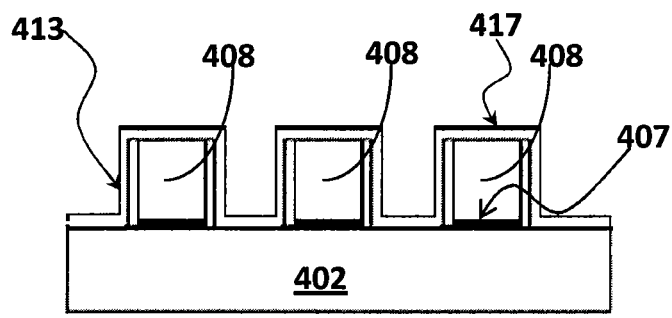
Figure 4E:
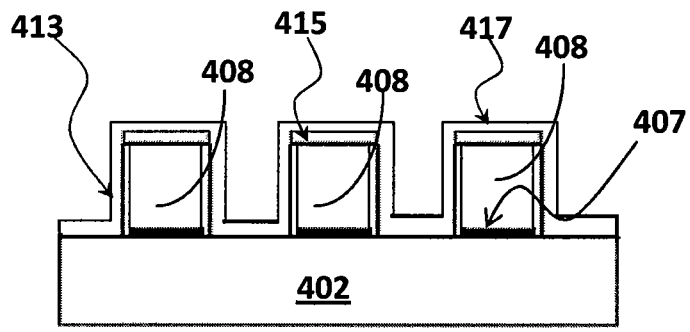

In certain embodiments, the passivating layer 415 as previously used in step 310 may be omitted. That is, after first sacrificial dielectric materials 404 in the trench regions between the conductive materials 408 have been removed, the ultra low-k dielectric layer 414 will deposit directly over the first via dielectric layer 402 to gap-fill the trench regions without selectively forming a passivating layer on the conductive materials 418. In such a case, the ultra low-k dielectric layer 414 may be polished back to expose the underlying conductive material 408, followed by deposition of a dielectric cap layer 417 as shown in FIG. 4E' (Alternative Embodiment A). Additionally or alternatively, the passivating layer 415 may be presented on the conductive materials 408 and the dielectric cap layer 417 is formed on the passivating layer 415 and the ultra low-k dielectric layer 414. In either case, the dielectric cap layer 417 provides an effective barrier to electromigration of copper into adjacent dielectric or ultra low-k dielectric layer that may be formed thereon.

In one alternative embodiment, after step 306, the dielectric cap layer may be conformally formed on structure, covering the conductive material 408, the self-forming manganese oxide ($MnO_x$) barrier layer 413, and exposed surfaces of the first via dielectric layer 402, as shown in FIG. 4E" (Alternative Embodiment B). In yet another embodiment, after step 310, the dielectric cap layer 417 may be conformally formed on the selectively deposited passivating layer 415, the self-forming manganese oxide ($MnO_x$) barrier layer 413, and exposed surfaces of the first via dielectric layer 402, as shown in FIG. 4E''' (Alternative Embodiment C). In either case, the dielectric cap layer 417 is formed to provide an effective barrier to electromigration of copper into adjacent dielectric or ultra low-k dielectric layer. In various embodiments described herein, the dielectric cap layer 417 may be any dielectrics materials such as SiCN, SiN, SiC, or SiOC/SiC. In one example, the dielectric cap layer 417 may be deposited to a thickness of about 5 Å to about 200 Å, for example, about 70 Å.

Figure 4F:
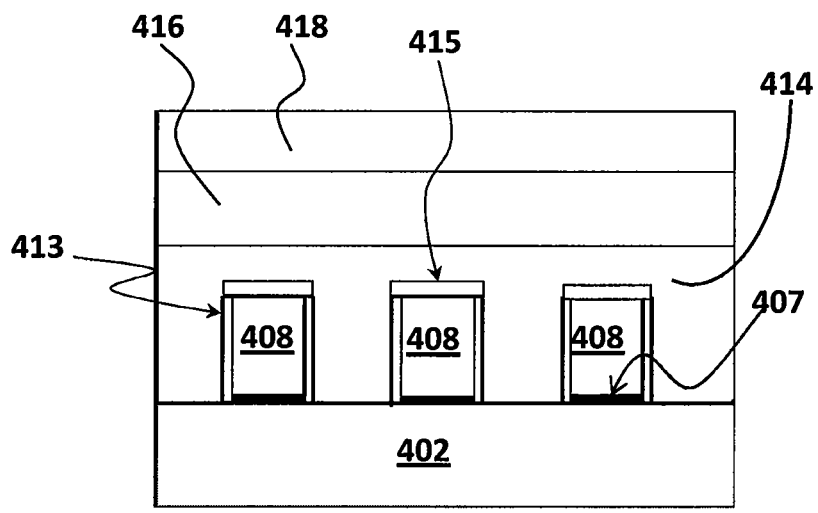
Figure 4G:
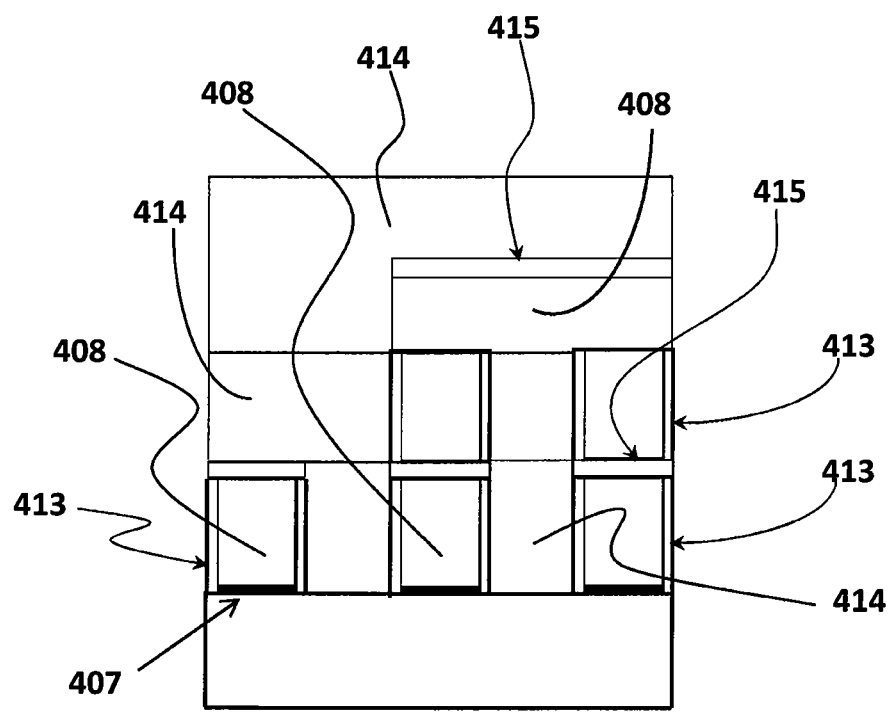

In step 314, after the ultra low-k (ULK) dielectric layer 414 have deposited over the first via dielectric layer 402, a second via dielectric layer 416 and a second sacrificial dielectric material 418 may be sequentially deposited on the ultra low-k dielectric layer 414, as shown in FIG. 4F. The material for the second via dielectric layer 416 and the second sacrificial dielectric material 418 may be similar to the first via dielectric layer 402 and the first sacrificial dielectric material 404, respectively, as discussed above at step 302. Alternatively, the second sacrificial dielectric material 418 may be the same as the first sacrificial dielectric material 404. The processes described in steps 302-314 may be repeated as necessary to extend the interconnect lines in the single damascene structure. Therefore, while not shown in FIG. 4F, it is contemplated that the second sacrificial dielectric material 418 may include metal features, such as copper interconnects, formed therein. FIG. 4G illustrates an exemplary single damascene structure that may be built on the ultra low-k dielectric layer 414 by the processes described in steps 302-314 with a desired pattern and trench etch process.

It should be understood that various metal passivation processes as described above with respect to FIGS. 4A-4E (including FIGS. 4E', 4E" and 4E''') can be applicable to the dual damascene process. For example, after step 212 and prior to filling of the conductive material 126 within the feature definitions 120, a barrier/seed layer as described above in step 304 may be conformally formed on the exposed surfaces of the feature definitions 120 to serve as a seed layer for the subsequent copper deposition while preventing diffusion of subsequent copper atoms into the surrounding low-k dielectrics. In such a case, the process described in step 216, i.e., after the sacrificial dielectric materials 118 have been removed, the post-treatment process as described above in step 308 may be performed to form a self-forming manganese oxide ($MnO_x$) barrier layer, thereby improving electrical properties such as electromigration resistance. Additionally, the metal encapsulation process as described above in step 310 may be performed to selectively deposit a passivating layer on the conductive material 126 to further enhance surface passivation of copper. Similarly, various examples for the dielectric cap layer as described above in step 312 may be incorporated into the process described in step 220 to provide an effective barrier to prevent copper migration into surrounding layers.

In contrast to conventional fabrication schemes having low-k damage problems, the inventive process flow prevents the ultra low-k material between the metal lines from exposing to various damaging processes during a damascene process such as etching, stripping, wet cleaning, pre-metal cleaning or CMP process, resulting in a damascene structure with an integrated or overall dielectric constant close to the bulk valve for the low-k materials. Various metal passivation processes which perform before or after filling of copper or removal of sacrificial dielectric materials further enhance copper electromigration resistance and therefore improving overall device performance.

While the foregoing is directed to embodiments of the present invention, other and further embodiments of the invention may be devised without departing from the basic scope thereof, and the scope thereof is determined by the claims that follow.

What is claimed is:

1. A method for forming a semiconductor structure, comprising:
   depositing a sacrificial dielectric material over a dielectric base layer;
   forming a damascene feature definition into the sacrificial dielectric material and the dielectric base layer;
   conformally forming a barrier layer on exposed side wall and bottom surfaces of the damascene feature definition, wherein the barrier layer is a tantalum/tantalum nitride (Ta/TaN) bilayer;
   conformally forming a seed layer on the barrier layer, wherein the seed layer comprises a copper-manganese (CuMn) alloy;
   subjecting the copper-manganese (CuMn) alloy with a thermal treatment process in an oxidizing atmosphere so that a portion or all of manganese within the CuMn alloy is oxidized to form a self-forming manganese oxide ($MnO_x$) layer;
   filling the damascene feature definition with a conductive material, wherein the conductive material is formed on the seed layer;
   removing the entire sacrificial dielectric material located in trench areas between the filled damascene feature definition;
   selectively depositing a passivating layer on a top surface of the conductive material, wherein the passivating layer comprises cobalt or a cobalt alloy; and
   filling the trench areas with an ultra low-k dielectric material having a dielectric constant less than about 3,
   wherein the thermal treatment process is performed before the removing the entire sacrificial dielectric material.

* * * * *

UNITED STATES PATENT AND TRADEMARK OFFICE
CERTIFICATE OF CORRECTION

PATENT NO. : 8,951,911 B2
APPLICATION NO. : 13/174621
DATED : February 10, 2015
INVENTOR(S) : Naik et al.

Page 1 of 1

It is certified that error appears in the above-identified patent and that said Letters Patent is hereby corrected as shown below:

In the Specification

Column 8, Line 2, please delete "4A-4D" and insert -- 4A-4G -- therefor.

Signed and Sealed this
Fourteenth Day of July, 2015

Michelle K. Lee
*Director of the United States Patent and Trademark Office*